(12) United States Patent
Matsuoka et al.

(10) Patent No.: US 10,287,159 B2
(45) Date of Patent: May 14, 2019

(54) MEMS DEVICE

(71) Applicant: Murata Manufacturing Co., Ltd., Nagaokakyo-shi, Kyoto-fu (JP)

(72) Inventors: Junya Matsuoka, Hamamatsu (JP); Nobuaki Tsuji, Hamamatsu (JP); Yuki Ueya, Hamamatsu (JP); Tsuyoshi Okami, Hamamatsu (JP); Takashi Mizota, Hamamatsu (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 242 days.

(21) Appl. No.: 15/363,431

(22) Filed: Nov. 29, 2016

(65) Prior Publication Data

US 2017/0073214 A1 Mar. 16, 2017

Related U.S. Application Data (63) Continuation of application No. PCT/JP2015/066006, filed on Jun. 3, 2015.

(30) Foreign Application Priority Data

Jun. 5, 2014 (JP) .................. 2014-116613

(51) Int. Cl.
*G01P 15/02* (2013.01)
*B81B 3/00* (2006.01)
(Continued)

(52) U.S. Cl.
CPC .............. *B81B 3/0013* (2013.01); *B81B 3/00* (2013.01); *B81C 1/00968* (2013.01);
(Continued)

(58) Field of Classification Search
CPC .................. G01P 2015/0871; B81B 3/0013
See application file for complete search history.

(56) References Cited

U.S. PATENT DOCUMENTS

| 5,760,354 A | 6/1998 | Asada |
|---|---|---|
| 2002/0149071 A1 | 10/2002 | Shim |

(Continued)

FOREIGN PATENT DOCUMENTS

| JP | H08213282 A | 8/1996 |
|---|---|---|
| JP | H08189935 A | 7/1998 |

(Continued)

OTHER PUBLICATIONS

International Search Report issued for PCT/JP2015/066006, dated Jul. 7, 2015.

(Continued)

*Primary Examiner* — John E Chapman, Jr.
(74) *Attorney, Agent, or Firm* — Arent Fox LLP (57) ABSTRACT

A MEMS device including a fixed member and a movable member supported via a resilient body. The MEMS device includes an impact alleviation mechanism provided at a position where the movable member and the fixed member collide during operation. The impact alleviation mechanism includes a stopper provided to either the fixed member or the movable member and that protrude to be parallel between sides of the two members with at least one side edge fixed to the respective member. Moreover, the impact alleviation mechanism includes an elongate protruding member provided on the other of the fixed member and the movable member. The elongate protruding member and the stopper are configured such that as collision force increases between the movable member and the fixed member during operation, an abutment area of an outer edge position of the elongate protruding member approaches the fixed side edge of the stopper.

18 Claims, 5 Drawing Sheets

(51) Int. Cl.
    *G01C 19/5769*    (2012.01)
    *H01L 29/84*    (2006.01)
    *B81C 1/00*    (2006.01)
    *G01P 15/08*    (2006.01)

(52) U.S. Cl.
    CPC .......... *G01C 19/5769* (2013.01); *G01P 15/02* (2013.01); *H01L 29/84* (2013.01); *B81B 2201/0235* (2013.01); *B81B 2201/0242* (2013.01); *G01P 2015/0871* (2013.01)

(56) References Cited

U.S. PATENT DOCUMENTS

2006/0114638 A1     6/2006    Casset et al.
2014/0091404 A1     4/2014    Suzuki
2017/0373611 A1*   12/2017   Cottone ................ B81B 3/0021

FOREIGN PATENT DOCUMENTS

| | | |
|---|---|---|
| JP | 2002326197 A | 11/2002 |
| JP | 2012-247193 A | 12/2012 |
| JP | 2013228243 A | 11/2013 |
| JP | 2014071097 A | 4/2014 |

OTHER PUBLICATIONS

Written Opinion of the International Searching Authority issued for PCT/JP2015/066006, dated Jul. 7, 2015.

\* cited by examiner

MEMS DEVICE

CROSS REFERENCE TO RELATED APPLICATIONS

The present application is a continuation of PCT/JP2015/066006 filed Jun. 3, 2015, which claims priority to Japanese Patent Application No. 2014-116613, filed Jun. 5, 2014, the entire contents of each of which are incorporated herein by reference.

TECHNICAL FIELD

The present disclosure generally relates to a MEMS device, and, more particularly, to a MEMS device that suppresses stiction and is not easily damaged during operation.

BACKGROUND ART

In recent years, a device having a fine mechanical element formed by utilizing semiconductor manufacturing technology called MEMS ("Micro Electro Mechanical Systems"; hereinafter a "MEMS device") has been developed, and implemented, for example, as a gyro sensor, an acceleration sensor, or the like.

Such a MEMS device often includes a movable vibration member supported by a substrate via a resilient body. It is known that in a MEMS device including a movable member, the movable member may adhere to another member due to a capillary force (i.e., a meniscus force) of a liquid used in the production process, i.e., a phenomenon called stiction may arise.

In order to prevent the stiction, certain MEMS device designs attempt to reduce a contact area between the movable member and the other member. In order to do so, a method is proposed in which, for example, a stopper in the form of a small protrusion that abuts against a movable member is provided to prevent the movable member from contacting the other member (see, e.g., Japanese Patent Laying-Open No. 2014-71097).

However, in the case of a MEMS device having a stopper as described above, when a device having mounted therein/thereon the MEMS device, for example, falls and an impact force acts thereon, the movable member may collide with the stopper violently and the movable member and/or the stopper may be damaged. As a result, damage of the movable member and/or the stopper may impair the MEMS device's function.

Patent document 1: Japanese Patent Laying-Open No. 2014-71097.

SUMMARY OF INVENTION

In view of the foregoing design limitations in conventional MEMS devices, an object of the present disclosure is to provide a MEMS device that can suppress stiction and is also less likely to be damaged during operation.

Thus, a MEMS device is disclosed herein that includes a fixed member and a movable member supported via a resilient body. In the exemplary aspect, the MEMS device includes an impact alleviation mechanism provided where the movable member and the fixed member collide or contact each other during operation. Moreover, the impact alleviation mechanism includes a stopper portion (i.e., a stopper) in a form of a strip provided to one of the fixed member and the movable member and that protrudes to be substantially perpendicular to a collision direction (i.e., parallel to an edge of the respective component). Moreover, the stopper has side edges among which at least one of the side edges is fixed. The impact alleviation mechanism further includes an elongate protruding member or portion provided to the other of the fixed member and the movable member. The elongate protruding portion and the stopper portion are configured such that in response to an increase in the collision force between the movable member and the fixed member, an abutment area's outer edge position approaches the fixed side edge of the stopper more closely.

Preferably, the MEMS device includes the impact alleviation mechanism in which the movable member and the fixed member abut at the elongate protruding portion. Accordingly, a contact area of the movable member and the fixed member via the impact alleviation mechanism is small, and stiction can be suppressed. Furthermore, in the exemplary MEMS device, the impact alleviation mechanism has the elongate protruding portion and the stopper portion configured such that in response to an increased collision force between the movable member and the fixed member, an abutment area's outer edge position approaches the fixed side edge of the stopper portion more closely. As such, in an initial stage of a collision, the stopper portion can flexibly deform and alleviate the movable member's collision force and thus prevent brittle fracture (cracking and chipping) of the elongate protruding portion and the stopper portion. Moreover, in a later stage of the collision, an apparent spring constant can be increased to suppress the stopper portion's deformation and a resultant stress concentration, which thereby prevents the stopper portion's ductile fracture. Accordingly, the MEMS device can suppress stiction despite a reduced space and is also less likely to be damaged when it receives an impact.

Preferably, the other side edge of the stopper portion is unfixed, and, in a cross section in the collision direction and a direction in which the stopper portion protrudes, the elongate protruding portion has an abutment surface curved to be raised between its apex's position and a portion of the elongate protruding portion corresponding to the fixed side edge of the stopper portion. Since the stopper portion is fixed in a cantilevered manner and in said cross section the elongate protruding portion has the abutment surface curved to be raised between the apex's position and the portion of the elongate protruding portion corresponding to the fixed side edge of the stopper portion, the abutment area's outer edge position is continuously and smoothly moved to be closer to the fixed side edge of the stopper portion in response to the larger collision force.

Preferably, when the elongate protruding portion abuts against the fixed side edge of the stopper portion, the stopper portion does not abut against the fixed member or the movable member from which the stopper portion is fixed. Thus, when the elongate protruding portion abuts against the fixed side edge of the stopper portion, the stopper portion does not abut against the fixed member or the movable member from which the stopper portion protrudes, so that in a collision process, the stopper portion's deformation is not inhibited and the stopper portion's apparent spring constant can be increased continuously and smoothly.

Preferably, the elongate protruding portion is formed in a strip protruding from the other of the fixed member and the movable member and having side edges among which at least one of the side edges is fixed. As a result, the elongate protruding portion and the stopper portion can alleviate collision force of the movable member and the fixed member. This can more effectively prevent damage of the movable member and the fixed member during vibration.

Preferably, the elongate protruding portion or the stopper portion is formed to be integrated with the fixed member or the movable member. As a result, the elongate protruding portion and/or stopper portion can easily and reliably form the impact alleviation mechanism in which the elongate protruding portion or the stopper portion is fine and less likely to be damaged.

As described herein, being "substantially perpendicular" indicates having an angle of 80 degrees or larger and 100 degrees or smaller. Similarly, being "parallel" indicates having an angle of less than 10 degrees variation.

According to the disclosure herein, the MEMS device having said impact alleviation mechanism can suppress stiction and is also less likely to be damaged when it receives an impact.

DETAILED DESCRIPTION OF EMBODIMENTS

Hereafter, reference will be made to the drawings, as appropriate, to describe embodiments of the present invention in detail.

[First Embodiment]

Figure 1:
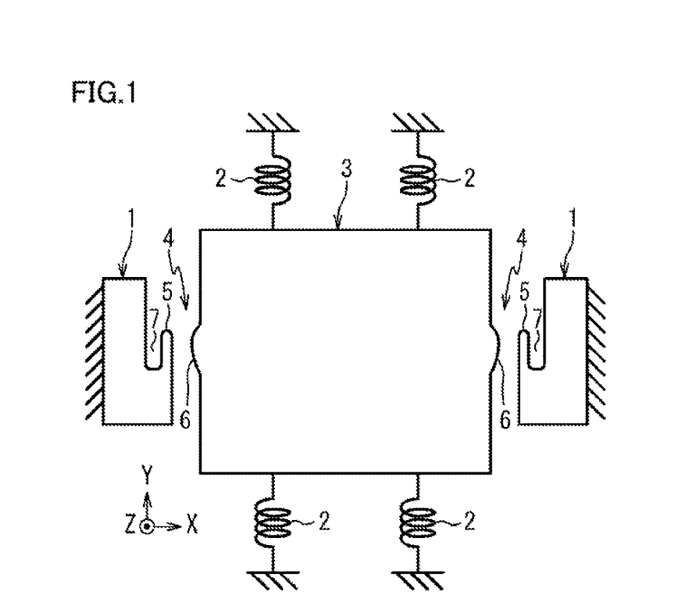
FIG. 1 is a schematic diagram showing a MEMS device of one exemplary embodiment.

FIG. 1 shows a MEMS device including a fixed member 1 and a movable member 3 supported via a resilient body 2, such that the movable member 3 can vibrate in an x-y direction.

Fixed member 1 and one end of resilient body 2 are fixed to a base such as a substrate (not shown). Movable member 3 is supported by resilient body 2 with a gap between movable member 3 and the base.

In operation, movable member 3 moves in the x direction against the resilient force of resilient body 2 and can thus collide with fixed member 1 in the x direction. An impact alleviation mechanism 4 is provided at a portion of fixed member 1 and movable member 3 where the two components may collide or contact each other during vibration of the movable member 3.

In one embodiment, fixed member 1, resilient body 2, and movable member 3 can be formed, for example, of silicon.

Moreover, fixed member 1, resilient body 2, and movable member 3 can have a thickness in a z direction perpendicular to the x-y direction (i.e., a depthwise direction through the plane of the figure), for example, of 10 μm or larger and 100 μm or smaller in one embodiment.

Figure 2:
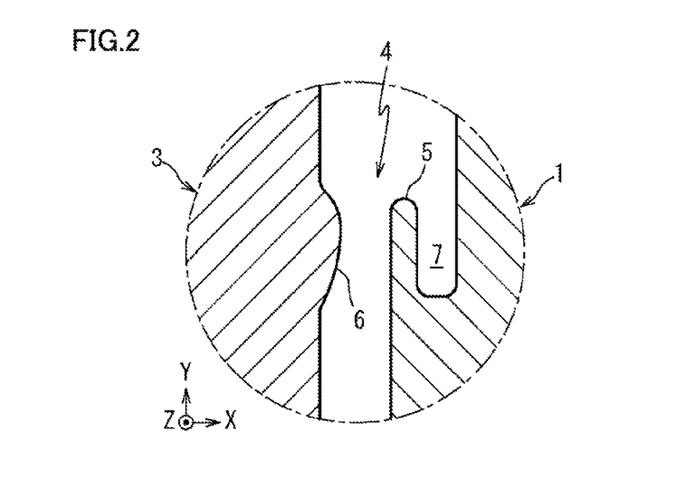
FIG. 2 is a schematic enlarged view of an impact alleviation mechanism of FIG. 1.

According to the exemplary embodiment, impact alleviation mechanism 4 shown enlarged in FIG. 2 has a stopper portion 5 (also referred to simply as a "stopper") in the form of a strip provided to fixed member 1 to protrude in a direction (the y direction) substantially perpendicular to a collision direction (the x direction). Moreover, the stopper portion 5 has side edges among which one of them is fixed. Furthermore, an elongate protruding portion 6 (also referred to as an "elongate protruding member") is provided on movable member 3 to protrude in the collision direction (the x direction). Furthermore, fixed member 1 is provided with a space 7 in the form of a slit or cavity behind stopper portion 5 (i.e., facing away from elongate protruding portion 6).

In the exemplary embodiment, fixed member 1, resilient body 2 and movable member 3, stopper portion 5 and elongate protruding portion 6 can all be formed for example of silicon, and are preferably formed to be integrated with fixed member 1 or movable member 3.

Stopper portion 5 is formed in the form of a strip extending in the z direction perpendicular to the x-y direction, and has in the y direction one side edge (a lower side in the figure) fixed to fixed member 1 and the other side edge (an upper side in the figure) is not fixed or free and extends in the direction away from the fixed side edge. As shown, the free end extends in a direction parallel to the edge/side of the fixed member 1.

In one embodiment, stopper portion 5 may have an average width (an average length in the y direction) capable of ensuring an amount of deformation required to alleviate an impact force caused when movable member 3 collides, and it can for example be 2 μm or more and 100 μm or less. It is noted that the width of stopper portion 5 may vary depending on the location in the z direction, and typically, it may vary in the z direction at a rate due to a constraint on production technology, and the like.

Stopper portion 5 may have an average thickness (an average length in the x direction) capable of ensuring strength and flexibility required depending on the mass of movable member 3 etc., and it can for example be 1 μm or more and 20 μm or less. It is noted that the thickness of stopper portion 5 may vary depending on the location in the z direction and that in the y direction, and typically, it may vary in the z direction at a rate due to a constraint on production technology, and the like.

In one aspect, stopper portion 5 in the z direction can have an average length equal to the average thickness of fixed member 1.

Furthermore, space 7 formed behind stopper portion 5 has a width in the x direction such that when stopper portion 5 is theoretically maximally bent, the free side edge or end of the stopper portion 5 does not abut against fixed member 1. More specifically, the width of space 7 in the x direction may be larger than an amount of movement of the free side edge of stopper portion 5 in the x direction when stopper portion 5 is bent at its fixed side edge to extend in a tangential direction at a portion of elongate protruding portion 6 that corresponds to the fixed side edge of stopper portion 5. This allows stopper portion 5 to have a continuously smoothly increasing apparent spring constant and thus smoothly absorb a kinetic momentum of movable member 3.

In the exemplary embodiment, elongate protruding portion 6 has an apex extending in the x direction such that the apex faces a portion of stopper portion 5 close to the side edge of the free end's side in the x direction. Furthermore, elongate protruding portion 6 has a surface that abuts against stopper portion 5, and, in a cross section in the collision direction (the x direction) and a direction in which stopper portion 5 protrudes (the y direction), elongate protruding portion 6 has the surface curved to be raised between the apex's position and a portion corresponding to the fixed side edge of stopper portion 5. Furthermore, in one aspect, the apex of elongate protruding portion 6 has an asymmetrical shape where one side in the y direction (or on the side of the fixed side edge of stopper portion 5) is longer (i.e., has a slowly decreasing curved side) than the other side in the same direction.

Moreover, elongate protruding portion 6 in the x direction has a maximum protrusion height designed, considering deformation which stopper portion 5 is expected to present, such that movable member 3 does not contact fixed member 1. For example, the protrusion height can, for example, be 0.1 μm or more and 20 μm or less. It is noted that the maximum protrusion height of elongate protruding portion 6 in the x direction may vary depending on the location in the z direction and that in the y direction, and typically, it may vary in the z direction at a rate due to a constraint on production technology, and the like.

Moreover, elongate protruding portion 6 at its base end (or at a plane serving as a boundary with movable member 3) can have in the y direction an average width for example of 0.7 or more times and 1.5 or less times of the average width of stopper portion 5 in the y direction.

In one aspect, elongate protruding portion 6 in the z direction can have an average length equal to the average thickness of movable member 3.

<Effect>

According to the exemplary embodiment, the MEMS device includes the above described impact alleviation mechanism 4 at a position where movable member 3 and fixed member 1 collide during vibration. Moreover, movable member 3 and fixed member 1 do not directly abut against each other and their contact area is small. Accordingly, stiction does not easily occur in the MEMS device.

Figure 3:
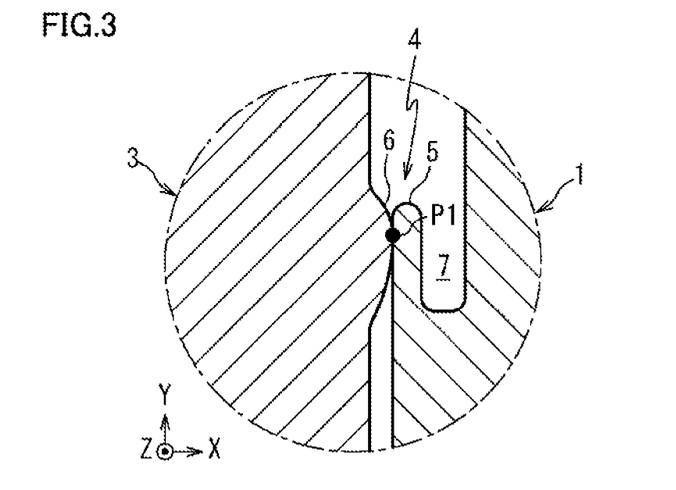
FIG. 3 is a schematic enlarged view showing the impact alleviation mechanism of FIG. 2 in an initial stage of a collision.

Furthermore, in the exemplary MEMS device, when movable member 3 collides with fixed member 1, initially, as shown in FIG. 3, the apex of elongate protruding portion 6 abuts against a position P1 close to the side edge of stopper portion 5 on the free end's side.

When movable member 3 further moves toward fixed member 1, elongate protruding portion 6 elastically deforms stopper portion 5 and curves stopper portion 5 to push the side edge of stopper portion 5 on the free end's side into space 7 behind. In other words, stopper portion 5 elastically deforms to function as a flat spring which receives a kinetic momentum of fixed member 1.

When stopper portion 5 is curved, as a result of the curved opposite surfaces of stopper portion 5 and elongate protruding portion 6, the apex of elongate protruding portion 6 in the x direction can no longer abut against stopper portion 5. That is, the larger the collision force of movable member 3 and fixed member 1 is, the larger the elastic deformation of stopper portion 5 is, and the position of the outer edge of the abutment area of elongate protruding portion 6 and stopper portion 5 moves to be close to the fixed side edge of stopper portion 5. It is noted that the abutment of elongate protruding portion 6 and stopper portion 5 will have a small area due to their elastic deformation, and accordingly the expression "contact area" is used and hereinafter its position will be referred to as "outer edge position." It is further noted that the contact area in impact alleviation mechanism 4 of FIG. 3 may be considered to be substantially in the form of a point in a plan view.

The closer the abutment area of elongate protruding portion 6 and stopper portion 5 is to the fixed side edge of stopper portion 5, the larger the apparent spring constant of stopper portion 5 will be (i.e., a ratio of effective reactive force in the x direction by elastic force of stopper portion 5 relative to displacement amount of elongate protruding portion 6 in the x direction). Accordingly, in an initial stage of a collision of movable member 3 with fixed member 1, stopper portion 5 alleviates the impact of the collision of elongate protruding portion 6 with stopper portion 5 by a relatively small spring constant and prevents their brittle fracture (cracking and chipping). In contrast, in a subsequent stage, stopper portion 5 gradually increases its apparent spring constant to suppress stress concentration attributed to deformation and receive a kinetic momentum of movable member 3 without ductile fracture.

Figure 4:
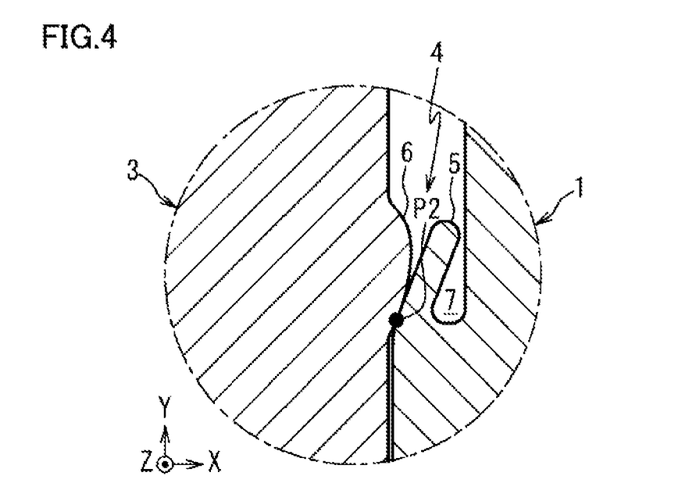
FIG. 4 is a schematic enlarged view showing the impact alleviation mechanism of FIG. 2 in a later stage of the collision.

The larger the kinetic momentum of movable member 3 is, the more closely the abutment area of elongate protruding portion 6 and stopper portion 5 approaches the fixed side edge of stopper portion 5, and accordingly, the apparent spring constant of stopper portion 5 is increased and the larger kinetic momentum of movable member 3 can be absorbed. Furthermore, as shown in FIG. 4, when an abutment area P2 of elongate protruding portion 6 and stopper portion 5 reaches the fixed side edge of stopper portion 5, the distance between the position of abutment area P2 (i.e., an action point) and the fixed side edge of stopper portion 5 (i.e., a fulcrum) in the y direction will substantially be zero, and accordingly, no bending moment acts on stopper portion 5, and the apparent spring constant of stopper portion 5 as a flat spring becomes extremely large. The stopper portion 5 thus having an increased apparent spring constant is protected against excessive deformation and hence ductile fracture.

When the components are in the state shown in FIG. 4, the amount of movement of movable member 3 permitted as the foot of stopper portion 5 and a portion of fixed member 1 that supports stopper portion 5 are compressed is larger than the amount of movement permitted as stopper portion 5 is bent. Furthermore, when stopper portion 5 and fixed member 1 compressively deform, elongate protruding portion 6 and movable member 3 adjacent to elongate protruding portion 6 also compressively deform. Such compressive deformation in the x direction gradually increases the abutment area of stopper portion 5 and elongate protruding portion 6 depending on the protrusion shape of the protruding portion 6. Furthermore, an apparent spring constant regarding compressive deformation of stopper portion 5 and fixed member 1 adjacent thereto as well as elongate protruding portion 6 and movable member 3 adjacent thereto increases as fixed member 1 moves in the x direction. Thus, in a later stage of the collision, the collision force is absorbed by the compressive deformation of stopper portion 5 and fixed member 1 adjacent thereto as well as elongate protruding portion 6 and movable member 3 adjacent thereto, and each member's ductile fracture is prevented by stress relaxation as the abutment area increases.

<Method of Producing MEMS Device>

According to an exemplary embodiment, the MEMS device can be produced in a method by: stacking on a material serving as a base (e.g., a silicon substrate) a material layer that forms fixed member 1, resilient body 2, movable member 3, and impact alleviation mechanism 4 (e.g., a silicon substrate) via a sacrifice layer; patterning said material layer by DRIE (Deep Reactive Ion Etching) or the like, to form a planar shape of fixed member 1, resilient body 2, movable member 3, and impact alleviation mechanism 4; and removing the sacrifice layer to separate resilient body 2, movable member 3, and impact alleviation mechanism 4 from the base.

According to this production method, impact alleviation mechanism 4 is formed to be integrated with fixed member 1 and movable member 3. That is, stopper portion 5 is formed as a portion of fixed member 1 and thus integrated with fixed member 1. Moreover, elongate protruding portion 6 is formed as a portion of movable member 3 and thus integrated with movable member 3. Thus, a fine impact alleviation mechanism 4 can be formed that is less likely to be damaged during operation and vibration.

[Second Embodiment]

Figure 5:
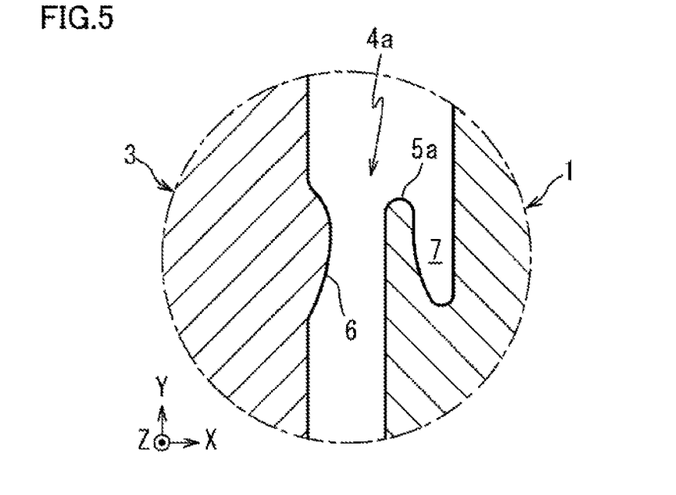
FIG. 5 is a schematic diagram of an impact alleviation mechanism of an alternative embodiment which is different from FIG. 2.

FIG. 5 illustrates an impact alleviation mechanism 4a that is applicable to the MEMS device of FIG. 1 as an alternative to impact alleviation mechanism 4 of FIG. 2.

As shown, impact alleviation mechanism 4a has a stopper portion 5a in the form of a strip provided to fixed member 1 to protrude in a direction (the y direction) substantially perpendicular to the collision direction (the x direction) and includes side edges among which one of them is fixed, and elongate protruding portion 6 provided to movable member 3 to protrude in the collision direction (the x direction). The configuration of elongate protruding portion 6 in impact alleviation mechanism 4a of FIG. 5 is similar to the shape and the like of elongate protruding portion 6 in impact alleviation mechanism 4 of FIG. 2. Accordingly, it will be not described again as such details are described above.

According to this embodiment, stopper portion 5a is formed in the form of a strip extending in the z direction perpendicular to the x-y direction, and has in the y direction one side edge fixed to fixed member 1 and the other side edge unfixed. As such, stopper portion 5a increases in thickness in the x direction toward the fixed side edge. Apart from this design variation, the configuration of stopper portion 5a in impact alleviation mechanism 4a of FIG. 5 has the same or similar shape as stopper portion 5 in impact alleviation mechanism 4 of FIG. 2. Accordingly, it will not be described again as such details are described above.

<Effect>

Impact alleviation mechanism 4a of FIG. 5 has stopper portion 5a increased in thickness toward the fixed side edge, and stopper portion 5a has an apparent spring constant increasing to be larger as the abutment area of elongate protruding portion 6 and stopper portion 5 moves. This further ensures prevention of excessive deformation in a later stage of a collision without decreasing an impact alleviation capability in an initial stage of the collision.

[Third Embodiment]

Figure 6:
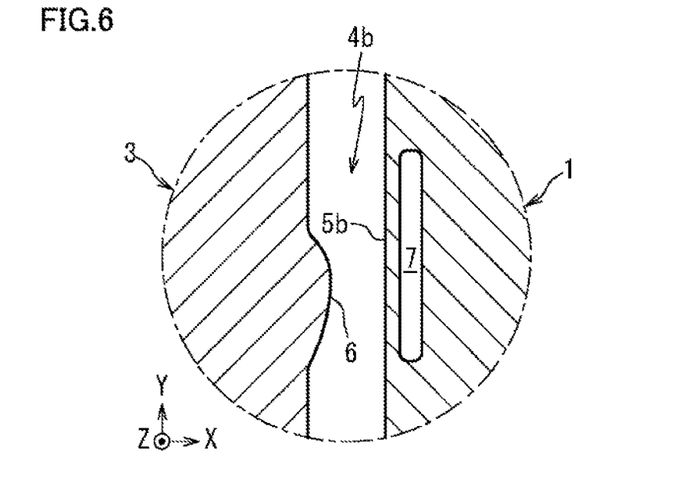
FIG. 6 is a schematic diagram of an impact alleviation mechanism of an alternative embodiment which is different from FIGS. 2 and 5.

FIG. 6 illustrates an impact alleviation mechanism 4b that is applicable to the MEMS device of FIG. 1 as an alternative to impact alleviation mechanism 4 of FIG. 2.

As shown, impact alleviation mechanism 4b has a stopper portion 5b in the form of a strip provided to fixed member 1 to protrude in a direction (the y direction) substantially perpendicular to the collision direction (the x direction) and having both side edges fixed, and elongate protruding portion 6 provided to movable member 3 to protrude in the collision direction (the x direction). Apart from this design variation, the configuration of elongate protruding portion 6 in impact alleviation mechanism 4b of FIG. 6 is similar in shape and the like of elongate protruding portion 6 in impact alleviation mechanism 4 of FIG. 2. Accordingly, it will be not described again as such details are described above.

As further shown, stopper portion 5b is formed in the form of a strip extending in the z direction perpendicular to the x-y direction, and has both side edges in the y direction fixed to fixed member 1. That is, this stopper portion 5b is fixed in a state where both ends thereof are supported. Furthermore, fixed member 1 is provided with space 7 behind stopper portion 5 such that even when elongate protruding portion 6 abuts against the fixed side edge of stopper portion 5b, stopper portion 5b does not abut against fixed member 1. Stopper portion 5b in impact alleviation mechanism 4b of FIG. 6 otherwise has the same or a similar shape as impact alleviation mechanism 4 of FIG. 2. Accordingly, it will not be described again as such details are described above.

<Effect>

According to this embodiment, in impact alleviation mechanism 4b of FIG. 6, in an initial stage of a collision, the apex of elongate protruding portion 6 in the x direction abuts against a vicinity of a center of stopper portion 5 as seen in the y direction. Subsequently, when elongate protruding portion 6 pushes and thus deforms stopper portion 5b in the x direction, with elongate protruding portion 6 having an abutment surface offset to one side in the y direction, the abutment area of elongate protruding portion 6 and stopper portion 5b is biased to expand on one side toward one fixed side edge of stopper portion 5b, and the abutment area's outer edge becomes close to one fixed side edge of stopper portion 5b. Accordingly, even in impact alleviation mechanism 4b of FIG. 6, the apparent spring constant of stopper portion 5b in response to a push-in amount by elongate protruding portion 6 in the x direction increases as collision force increases. Thus, impact alleviation mechanism 4b of FIG. 6 can establish both prevention of brittle fracture in an initial stage of a collision and prevention of ductile fracture in a later stage of the collision.

[Fourth Embodiment]

Figure 7:
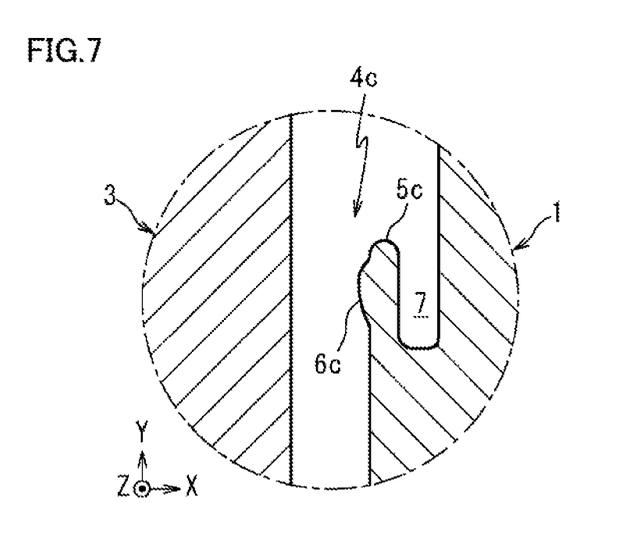
FIG. 7 is a schematic diagram of an impact alleviation mechanism of an alternative embodiment which is different from FIGS. 2, 5 and 6.

FIG. 7 illustrates an impact alleviation mechanism 4c that is applicable to the MEMS device of FIG. 1 as an alternative to impact alleviation mechanism 4 of FIG. 2.

As shown, impact alleviation mechanism 4c has a stopper portion 5c in the form of a strip provided to fixed member 1 to protrude in a direction (the y direction) substantially perpendicular to the collision direction (the x direction) and having one side edge fixed and the other side edge unfixed, and an elongate protruding portion 6c provided to stopper portion 5c to protrude in the collision direction (the x direction). Apart from this design variation, the configuration of stopper portion 5c in impact alleviation mechanism 4c of FIG. 7 is similar to the shape of stopper portion 5 in impact alleviation mechanism 4 of FIG. 2. Accordingly, its description will not be described again and can be referred to above. Furthermore, the configuration of elongate protruding portion 6c in impact alleviation mechanism 4c of FIG. 7 other than its location is similar to the shape of elongate protruding portion 6 in impact alleviation mechanism 4 of FIG. 2. Accordingly, it will be not described again as such details are described above.

<Effect>

According to the configuration of stopper portion 5c of impact alleviation mechanism 4c of FIG. 7, initially the apex of elongate protruding portion 6c abuts against movable member 3 and a collision force causes stopper portion 5c to elastically deform so that the abutment area of elongate protruding portion 6c and movable member 3 moves toward the fixed side edge of stopper portion 5c. Thus, the larger the collision force of movable member 3 and fixed member 1, the larger the apparent spring constant of stopper portion 5c. Thus, impact alleviation mechanism 4c of FIG. 7 can establish both prevention of brittle fracture in an initial stage of a collision and prevention of ductile fracture in a later stage of the collision.

[Fifth Embodiment]

Figure 8:
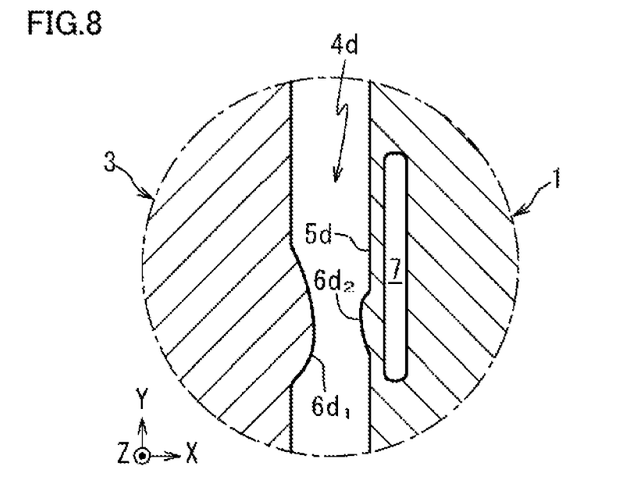
FIG. 8 is a schematic diagram of an impact alleviation mechanism of an alternative embodiment which is different from FIGS. 2 and 5-7.

FIG. 8 illustrates an impact alleviation mechanism 4d that is applicable to the MEMS device of FIG. 1 as an alternative to impact alleviation mechanism 4 of FIG. 2.

The FIG. 8 impact alleviation mechanism 4d has a stopper portion 5d in the form of a strip provided to fixed member 1 to protrude in a direction (the y direction) substantially perpendicular to the collision direction (the x direction) and having both side edges fixed, a first elongate protruding portion $6d_1$ provided to movable member 3 to protrude in the collision direction (the x direction), and a second elongate protruding portion $6d_2$ provided to stopper portion 5d to protrude in the collision direction (the x direction). Apart from this design variation, the configuration of stopper portion 5d in impact alleviation mechanism 4d of FIG. 8 is similar to the shape of stopper portion 5a in impact alleviation mechanism 4a of FIG. 5. Accordingly, it will not be described again as such details are described above.

According to this embodiment, first elongate protruding portion $6d_1$ and second elongate protruding portion $6d_2$ are formed in a shape such that as movable member 3 approaches fixed member 1 first elongate protruding portion $6d_1$ and second elongate protruding portion $6d_2$ abut against each other and the collision force causes stopper portion 5d to elastically deform so that the abutment area of first elongate protruding portion $6d_1$ and second elongate protruding portion $6d_2$ moves toward one fixed side edge of stopper portion 5d.

Moreover, first elongate protruding portion $6d_1$ and second elongate protruding portion $6d_2$ in impact alleviation mechanism 4d of FIG. 8 can have a width, a projection height, etc. which are similar to the shape etc. of elongate protruding portion 6 in impact alleviation mechanism 4 of FIG. 2.

Second elongate protruding portion $6d_2$ in the z direction can have an average length equal to the average thickness of movable member 3.

<Effect>

According to this embodiment, impact alleviation mechanism 4d of FIG. 8 having second elongate protruding portion $6d_2$ facing elongate protruding portion 6d can optimize an amount of movement of the abutment area toward the fixed side edge relative to an amount of movement of movable member 3 without making elongate protruding portion 6d large and decreasing stopper portion 5d's apparent spring constant in an initial stage of a collision.

[Sixth Embodiment]

Figure 9:
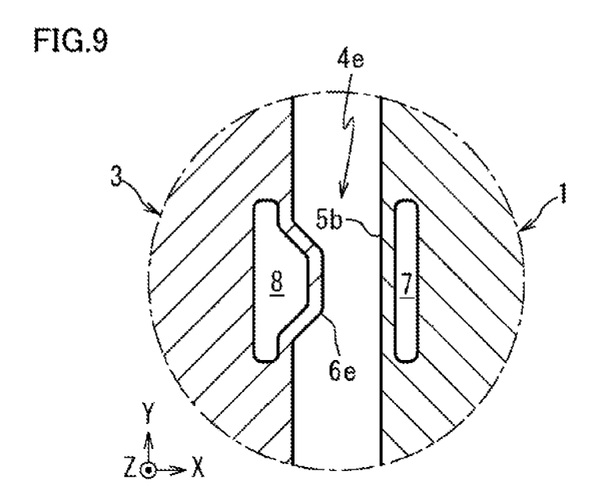
FIG. 9 is a schematic diagram of an impact alleviation mechanism of an alternative embodiment which is different from FIGS. 2 and 5-8.

FIG. 9 illustrates an impact alleviation mechanism 4e that is applicable to the MEMS device of FIG. 1 as an alternative to impact alleviation mechanism 4 of FIG. 2.

The FIG. 9 impact alleviation mechanism 4e has stopper portion 5b in the form of a strip provided to fixed member 1 to protrude in a direction (the y direction) substantially perpendicular to the collision direction (the x direction) and having both side edges fixed. Moreover, an elongate protruding portion 6e is provided on movable member 3 to protrude in the collision direction (the x direction). The configuration of stopper portion 5b in impact alleviation mechanism 4e of FIG. 9 is similar to the configuration of stopper portion 5b in impact alleviation mechanism 4b of FIG. 6. Accordingly, it will not be described again as such details are described above.

Elongate protruding portion 6e of impact alleviation mechanism 4e of FIG. 9 is curved to protrude in the collision direction (the x direction) substantially in the form of a trapezoid and formed in the form of a strip extending in the z direction, and has opposite side edges in the y direction fixed to movable member 3. Behind elongate protruding portion 6e (on a side facing away from fixed member 1), a space 8 is formed to allow elongate protruding portion 6e to recede through elastic deformation. This elongate protruding portion 6e may be offset relative to stopper portion 5b in the y direction.

In this embodiment, elongate protruding portion 6e may have an average thickness designed to be capable of ensuring strength and flexibility required depending on the mass of movable member 3 and the like, and it can for example be 1 μm or more and 20 μm or less. It is noted that the thickness of elongate protruding portion 6e may vary depending on the location in the z direction and that in the y direction, and typically, it may vary in the z direction at a rate due to a constraint on production technology, and the like.

In one aspect, elongate protruding portion 6e in impact alleviation mechanism 4e of FIG. 9 can have an average projection height in the x direction and a length in the z direction which are similar to the average projection height and the length in the z direction of elongate protruding portion 6 in impact alleviation mechanism 4 of FIG. 1.

<Effect>

Impact alleviation mechanism 4e of FIG. 9 has stopper portion 5b and elongate protruding portion 6e both elastically deformed and thus alleviates an impact of a collision of movable member 3 with fixed member 1. Furthermore, in impact alleviation mechanism 4e of FIG. 9, the larger the collision force of movable member 3 and fixed member 1 is, the larger the abutment area of stopper portion 5b and elongate protruding portion 6e is, and the abutment area's opposite, outer edge positions in the y direction approach the fixed side edges, respectively, of stopper portion 5b. Thus, impact alleviation mechanism 4e of FIG. 9 can establish both prevention of brittle fracture in an initial stage of a collision and prevention of ductile fracture in a later stage of the collision.

The above embodiments do not limit the configuration of the present invention. Accordingly, the above embodiments can have each portion with a constituent element omitted, replaced or added based on the disclosure in the present specification and common knowledge in the art and they should all be construed to belong to the scope of the present invention.

While in each above embodiment a fixed member is provided with a stopper portion (i.e., a stopper), a movable member may be provided with a stopper portion and the stopper portion or the fixed member may be provided with an elongate protruding portion (i.e., elongated protruding member) as would be appreciated to one skilled in the art.

Furthermore, when the elongate protruding portion is formed in a strip, it may have only one side edge fixed and the other side edge unfixed, i.e., it may be cantilevered.

Furthermore, the stopper portion or the elongate protruding portion may be formed separately from the fixed member and the movable member and attached thereto.

Furthermore, an elongate protruding portion in the form of a projection may be formed symmetrically frontwardly and rearwardly as seen in a direction in which the stopper portion protrudes as a strip as shown in FIG. 9.

Furthermore, for large collision force, the stopper portion itself may abut against the fixed member or movable member from which the stopper portion protrudes, and may thereby rapidly increase reactive force.

Furthermore, in the MEMS device, the number of impact alleviation mechanisms and each mechanism's position can be changed as desired.

The MEMS device can suitably be utilized for example as a MEMS device such as an acceleration sensor and a gyro sensor.

REFERENCE SIGNS LIST

1: fixed member; 2: resilient body; 3: movable member; 4, 4a, 4b, 4c, 4d, 4e: impact alleviation mechanism; 5, 5a, 5b, 5c, 5d: stopper portion; 6, 6c, $6d_1$, $6d_2$, 6e: elongate protruding portion; 7, 8: space.

The invention claimed is:

1. A MEMS device comprising:
    a fixed member;
    a movable member coupled to the fixed member by at least one resilient body; and
    an impact alleviation mechanism having:
        a stopper disposed between the fixed member and the movable member and extending in a direction parallel to respective sides of the fixed member and the movable member, the stopper having side edges of which at least one of the side edges is fixed to the fixed member or the movable member, and
        an elongate protruding member disposed on the other of the fixed member and the movable member that is not fixed to the stopper, such that the elongate protruding member protrudes towards the stopper
    wherein the stopper includes a pair of side edges and is fixed to the fixed member or the movable member to define a space between the stopper and the fixed member or the movable member to which the stopper is fixed.

2. The MEMS device according to claim 1, wherein the elongate protruding member and the stopper are configured such that as a collision force increases between the movable member and the fixed member when the movable member vibrates, an outer edge position of an abutment area of the elongate protruding member approaches the fixed side edge of the stopper.

3. The MEMS device according to claim 1, wherein only one side edge of the stopper is fixed to the fixed member or the movable member and the other side edge of the stopper is not fixed and extends between the fixed member and the movable member.

4. The MEMS device according to claim 3, wherein the elongate protruding member has an abutment surface that is curved to be raised between an apex of the elongate protruding member facing the stopper and a portion of the elongate protruding member adjacent to the fixed side edge of the stopper.

5. The MEMS device according to claim 1, wherein, when the elongate protruding member abuts against the fixed side edge of the stopper, the stopper does not abut against the fixed member or the movable member to which the stopper is fixed.

6. The MEMS device according to claim 1, wherein the elongate protruding member is a strip protruding from the other of the fixed member and the movable member.

7. The MEMS device according to claim 6, wherein the elongate protruding member includes a pair of side edges fixed to the other of the fixed member and the movable member and the strip is curved to protrude towards the stopper.

8. The MEMS device according to claim 1, wherein at least one of the elongate protruding member or the stopper is formed to be integrated with the fixed member or the movable member.

9. The MEMS device according to claim 1, wherein the stopper has a width that increases as the stopper extends towards the side edge fixed to the fixed member or the movable member.

10. The MEMS device according to claim 1, wherein the impact alleviation mechanism comprises another elongate protruding member on the stopper and facing the elongate protruding member.

11. The MEMS device according to claim 1, wherein the elongate protruding member has an asymmetrical shape with one side extending from an apex of the elongate protruding member being longer than the other side extending from the apex of the elongate protruding member.

12. A MEMS device comprising:
    a movable member having a stopper with at least one side edge of the stopper fixed to a side of the movable member such that the stopper extends in a direction parallel to the side of the movable member to define a space therebetween; and
    a fixed member coupled to the movable member by at least one resilient body, the fixed member including an elongate protruding member disposed on a side of the fixed member facing the side of the movable member, such that the elongate protruding member protrudes towards the stopper,
    wherein the stopper includes a pair of side edges and is fixed to the movable member to define the space between the stopper and the movable member.

13. The MEMS device according to claim 12, wherein the elongate protruding member and the stopper are configured such that as a collision force increases between the movable member and the fixed member when the movable member vibrates, an outer edge position of an abutment area of the elongate protruding member approaches the fixed side edge of the stopper.

14. The MEMS device according to claim 12, wherein only one side edge of the stopper is fixed to the movable member and the other side edge of the stopper is not fixed and extends between the movable member and the fixed member.

15. The MEMS device according to claim 12, wherein the elongate protruding member has an asymmetrical shape with one side extending from an apex of the elongate protruding member being longer than the other side extending from the apex of the elongate protruding member.

16. A MEMS device comprising:
    a fixed member having a stopper with at least one side edge of the stopper fixed to a side of the fixed member such that the stopper extends in a direction parallel to the side of the fixed member to define a space therebetween; and
    a movable member coupled to the fixed member by at least one resilient body, the movable member including an elongate protruding member disposed on a side of the movable member facing the side of the fixed member, such that the elongate protruding member protrudes towards the stopper, wherein the stopper includes a pair of side edges and is fixed to the fixed member to define the space between the stopper and the fixed member.

17. The MEMS device according to claim 16, wherein the elongate protruding member and the stopper are configured such that as a collision force increases between the movable member and the fixed member when the movable member vibrates, an outer edge position of an abutment area of the elongate protruding member approaches the fixed side edge of the stopper.

18. The MEMS device according to claim 16, wherein the elongate protruding member has an asymmetrical shape with one side extending from an apex of the elongate protruding member being longer than the other side extending from the apex of the elongate protruding member.

* * * * *